US006614276B2

United States Patent
Robertson et al.

(10) Patent No.: US 6,614,276 B2
(45) Date of Patent: Sep. 2, 2003

(54) FLIP-FLOP DESIGN (75) Inventors: Iain Robertson, Bedfordshire (GB); Richard Simpson, Bedford (GB)

(73) Assignee: Texas Instruments Incorporated, Dallas, TX (US)

( * ) Notice: Subject to any disclaimer, the term of this patent is extended or adjusted under 35 U.S.C. 154(b) by 97 days.

(21) Appl. No.: 09/874,646

(22) Filed: Jun. 5, 2001

(65) Prior Publication Data

US 2002/0005745 A1 Jan. 17, 2002

(30) Foreign Application Priority Data

Jun. 6, 2000 (GB) .............................................. 0013790

(51) Int. Cl.7 .............................................. H03K 3/356
(52) U.S. Cl. ........................ 327/211; 327/138; 327/202; 327/218; 327/219
(58) Field of Search ................................ 327/198–203, 327/208, 210–215, 218, 219, 225

(56) References Cited

U.S. PATENT DOCUMENTS

| 5,189,315 A | * | 2/1993 | Akata .......................... 327/203 |
| 5,654,658 A | * | 8/1997 | Kubota et al. ............... 327/202 |
| 6,198,323 B1 | * | 3/2001 | Offord ......................... 327/202 |

FOREIGN PATENT DOCUMENTS

| EP | 0 472 426 A2 | | 8/1991 |
| JP | 55079524 A | * | 6/1980 |
| JP | 55-079524 | | 6/1980 |
| JP | 61-079318 | | 4/1986 |
| JP | 61079318 A | * | 4/1986 |
| JP | 404002212 A | * | 1/1990 |

* cited by examiner

Primary Examiner—Terry D. Cunningham
Assistant Examiner—Long T Nguyen
(74) Attorney, Agent, or Firm—J. Dennis Moore; W. James Brady, III; Frederick J. Telecky, Jr.

(57) ABSTRACT

A scannable asynchronous preset and/or clear flip-flop having latch circuits 27 and 30. Latch circuit 27 comprises an inverter 28 and a tristate NAND gate 29. Latch circuit 30 comprises an inverter 31 and a tristate NOR gate 32. When the CLK (clock input signal) and CLRZ (the inverse of the clear input signal) are both low, the output of the tristate NOR gate 32 is forced low. Thus the input of inverter 31 is low so that the output signal, Q, is forced low and the inverse output signal, QZ, is forced high. When CLK is high and CLRZ is low the output of tristate NAND gate 29 is forced high so that the input to inverter 28 is high and the input to inverter 31 is low, thereby forcing Q low and QZ high. Thus the outputs Q and QZ are forced low and high respectively when CLRZ is low, regardless of the state of the CLK input.

5 Claims, 6 Drawing Sheets

FLIP-FLOP DESIGN

This application claims priority under 35 USC §119(e)(1) of United Kingdom Application Number GB 0013790.1, filed Jun. 6, 2000.

1. Technical Field of the Invention

This invention relates generally to flip flop design, and more particularly to designs for high performance flip-flops.

2. Background of the Invention

FIGS. 1 to 4 relate to a known scannable flip-flop. A circuit symbol 1 for the device is given in FIG. 1. The flip-flop has data inputs D and SD, control inputs ScanZ and CLK and outputs Q, QZ and SQ. (In this description, the letter Z will denote an inverted signal, so that the output QZ is the inverse of the output Q.) In practice for testing purposes many such flip-flops are linked together in a shift register with the SQ output of each being connected to the SD input of the next.

Figure 2:
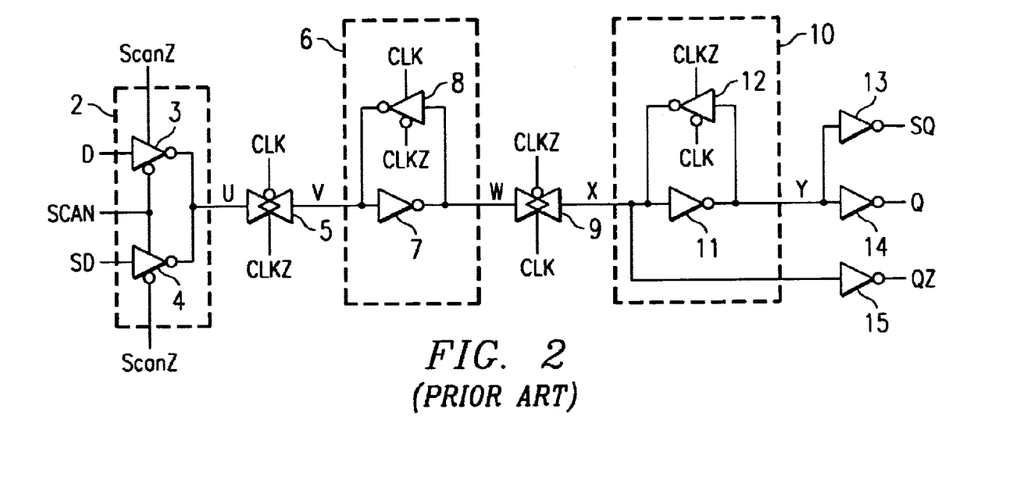
FIG. 2 is a circuit schematic of the scannable flip-flop of FIG. 1.

The circuit schematic for the known scannable flip-flop is given in FIG. 2. The SD and D inputs are coupled to the input of a multiplexer 2, that multiplexer comprising two tristate inverters 3 and 4. Tristate inverter 3 inverts the D input when the ScanZ input is high (i.e. when Scan is low) and is high impedance when ScanZ is low. Conversely, tristate inverter 4 inverts the SD input when ScanZ is low and is high impedance when ScanZ in high. Thus the output of the multiplexer 2 is either DZ (the inverse of D) or SDZ (the inverse of SD) dependent on the Scan input.

The output of the multiplexer 2 is coupled to the input of a transmission gate 5 which passes the input to the output when CLK is low (CLKZ high) and is high impedance when CLK is high (CLKZ low). The output of the transmission gate 5 is coupled to the input of latch 6, that latch comprising an inverter 7 and a tristate inverter 8. Inverter 7 inverts the output of transmission gate 5 and tristate inverter 8 inverts the output of inverter 7 when CLK is high. The output of tristate inverter 8 is coupled to the input of inverter 7, thereby creating a feedback loop when CLK is high. The output of the tristate inverter is high impedance when CLK is low so that the feedback loop is broken when CLK goes from high to low.

The output of latch 6 is coupled to the input of a second transmission gate 9, that transmission gate passing the output of latch 6 when CLK is high and blocking that output signal when CLK is low. The output of transmission gate 9 is coupled to the input of a second latch 10 comprising an inverter 11 and a tristate inverter 12. The output of the transmission gate 9 is coupled to the input of inverter 11 and the output of inverter 11 is coupled to the input of tristate inverter 12. That tristate inverter 12 acts as an inverter when CLK is low and is high impedance when CLK is high. The output of the tristate inverter 12 is coupled to the input of inverter 11. Thus the second latch 10 is functionally equivalent to the first latch 6, except that the control signals for the tristate inverters 8 and 12 are connected so that when the feedback loop is connected in latch 6 it is disconnected in latch 10 and vice versa.

The output of the latch 10 (i.e. the output of inverter 11) is coupled to inverters 13 and 14 to provide the SQ and Q outputs respectively. The input to latch 10 (i.e. the output of transmission gate 9) is coupled to an inverter 15 to provide the QZ output.

Figure 3:
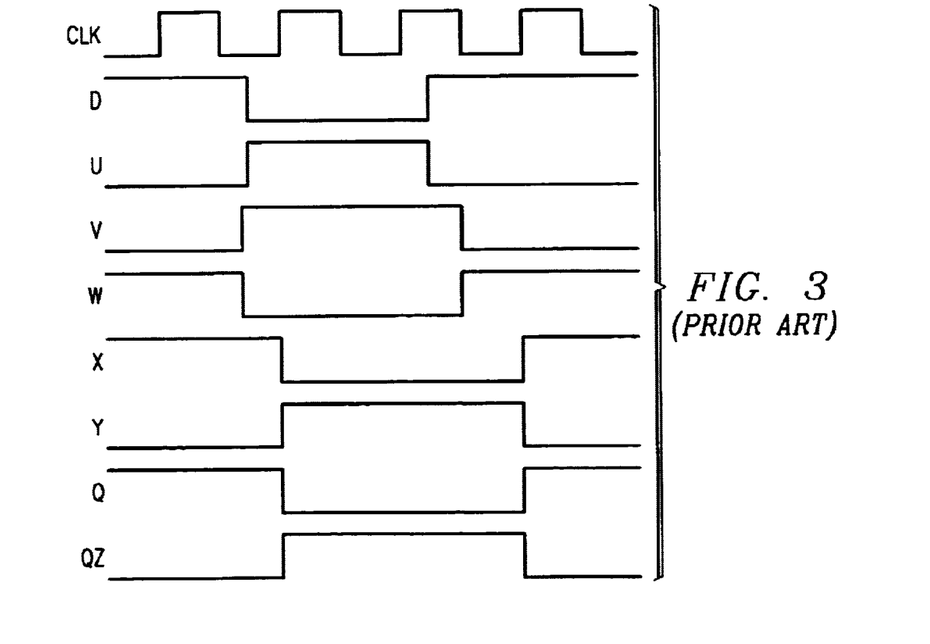
FIG. 3 is a timing diagram illustrating part of the functionality of the circuit of FIGS. 1 and 2.

The operation of the scannable flip-flop of FIGS. 1 and 2 will now be described with reference to the schematic of FIG. 2 and the timing diagram of FIG. 3. A number of nodes in the circuit of FIG. 2 have been labelled and the voltages at those nodes are shown in FIG. 3. Node U is the output of multiplexer 2, Node V is the output of transmission gate 5, node W is the output of latch 6, node X is the output of transmission gate 9 and node Y is the output of latch 10.

The timing diagram of FIG. 3 assumes that the ScanZ input is high so that the output of the multiplexer 2 is the inverse of the D input.

The D input shown in the timing diagram of FIG. 3 is initially high, falls whilst the CLK signal is low and rises again whilst the CLK signal is high. This is to illustrate the behaviour in the general case when the D signal is asynchronous with the CLK signal. Node U is simply the inverse of the D input. The voltage at node V is dependent on the transmission gate 5 and the tristate inverter 8. When CLK is low, the voltage at V follows the voltage at U. When CLK is high, the voltage at V follows the output of tristate inverter 8. When CLK is high, the output of tristate inverter 8 is the inverse of signal W.

In the example of FIG. 3, V is initially low since both CLK and U are low; W is high. When CLK goes high, V is the inverse of W and therefore remains low. When U rises, V rises at the same time (subject to a propagation delay through the transmission gate 5). W therefore falls at the same time. Now when CLK is high, V remains high as it follows the inverse of W. When the value of U falls, CLK is high so that the transmission gate is non-conducting, therefore V remains high (the inverse of W) until CLK is low. The falling edge of V is therefore delayed so that it is synchronised with the falling edge of CLK. Thus far, the rising edge of D has not, however, been synchronised with the CLK signal.

When CLK is high, the voltage at X follows the voltage at W. When CLK is low, the voltage at X is the inverse of signal Y. Thus X is initially high since W is high (the circuit is assumed to be stable at the start of the timing diagram). When CLK and W are both low, X is the inverse of Y and therefore remains high. X remains high until CLK rises again since when CLK is high, X follows W, which is already low and therefore pulls X low. W rises again at the same time as CLK falls. Thus W rises at the same time as transmission gate 9 becomes non-conducting. Thus X does not follow W at this point but stays low (being the inverse of Y). It is not until CLK rises, so that X once again follows W, that X rises. Therefore both the rising and falling edges of X are synchronised with the rising edge of the CLK signal.

The remainder of the circuit performs simple inversions so that at each rising edge of the CLK signal, the Q output takes on the value of the D input and the QZ output takes on the inverse of that D input.

Figure 1:
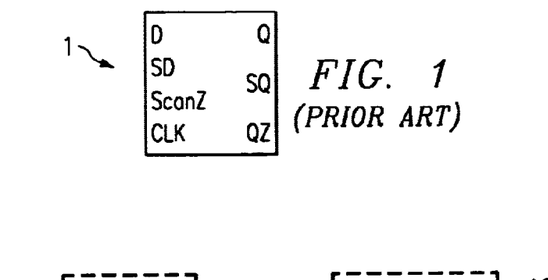
FIG. 1 is a circuit symbol for a scannable flip-flop.
Figure 4:
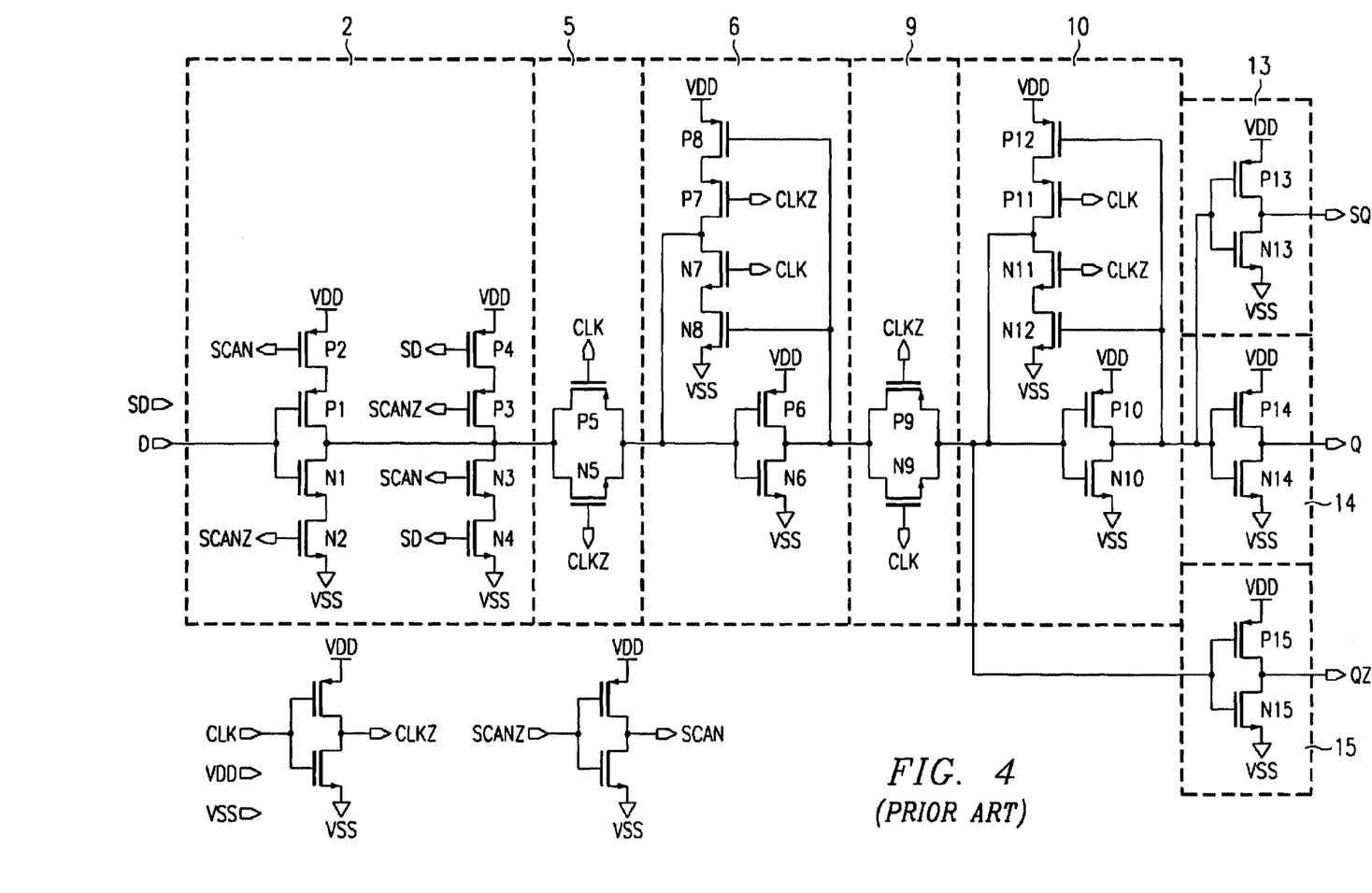
FIG. 4 is one possible transistor level implementation of the scannable flip-flop of FIGS. 1 and 2.

FIG. 4 shows a transistor level implementation of the scannable flip-flop of FIGS. 1 and 2. The circuit comprises a plurality of NMOS transistors (N1 to N15) and a plurality of PMOS transistors (P1 to P15). Each transistor comprises a gate input, a source input and a drain input.

The gate input of transistor N1 is coupled to the gate input of P1 and to the D input. The gate of transistor P2 is coupled to the Scan input and the gate of transistor N2 is coupled to the ScanZ input. The source of P2 is coupled to the voltage supply VDD, the drain of P2 is coupled to the source of P1, the drain of P1 is coupled to the drain of N1, the source of N1 is coupled to the drain of N2 and the source of N2 is coupled to the voltage supply VSS. The drain of P1 and the drain of N1 are also coupled to the drain of P3 and the drain of N3. The source of P3 is coupled to the drain of P4 and the source of P4 is coupled to the voltage supply VDD. The source of N3 is coupled to the drain of N4 and the source of N4 is coupled to the voltage supply VSS. The gates of P3 and P4 are connected to ScanZ and SD respectively and the of N3 and N4 are connected to Scan and SD respectively. The transistors N1 to N4 and P1 to P4 collectively make up the multiplexer 2 of FIG. 2.

The drain of P3 and the drain of N3 are also coupled to the drain of P5 and the drain of N5. The source of N5 is coupled to the source of P5. The gates of N5 and P5 are connected to CLKZ and CLK respectively. Transistors N5 and P5 make up the transmission gate 5 of FIG. 2.

The source of N5 and the source of P5 are also coupled to the gate of N6 and gate of P6. The source of P6 is coupled to the voltage supply VDD, the drain of P6 is coupled to the drain of N6 and the source of N6 is coupled to the voltage supply VSS. The drain of N6 and the drain of P6 are also coupled to the gate of N8 and the gate of P8. The gates of N7 and P7 are coupled to CLK and CLKZ respectively. The source of P8 is coupled to the voltage supply VDD, the drain of P8 is coupled to the source of P7, the drain of P7 is coupled to the drain of N7, the source of N7 is coupled to the drain of N8 and the source of N8 is coupled to the voltage supply VSS. The drain of P7 and the drain of N7 are also coupled to the source of P5, the source of N5, the gate of P6 and the gate of N6. The transistors N6 to N8 and P6 to P8 make up the latch 6 of FIG. 2.

The drain of P6, the drain of N6, the gate of P8 and the gate of N8 are also coupled to the drain of P9 and the drain of N9. The source of N9 is coupled to the source of P9. The gates of N9 and P9 are connected to CLK and CLKZ respectively. Transistors N9 and P9 make up the transmission gate 9 of FIG. 2.

The source of N9 and the source of P9 are also coupled to the gate of N10 and the gate of P10. The source of P10 is coupled to the voltage supply VDD, the drain of P10 is coupled to the drain of N10 and the source of N10 is coupled to the voltage supply VSS. The drain of N10 and the drain of P10 are also coupled to the gate of N12 and the gate of P12. The gates of N11 and P11 are coupled to CLKZ and CLK respectively. The source of P12 is coupled to the voltage supply VDD, the drain of P12 is coupled to the source of P11, the drain of P11 is coupled to the drain of N11, the source of N11 is coupled to the drain of N12 and the source of N12 is coupled to the voltage supply VSS. The drain of P11 and the drain of N11 are also coupled to the source of P9, the source of N9, the gate of P10 and the gate of N10. The transistors N10 to N12 and P10 to P12 make up the latch 10 of FIG. 2.

The drain of P10, the drain of N10, the gate of P12 and the gate of N12 are coupled to the gates of transistors N13, N14, P13 and P14. The source of P13 is coupled to the voltage supply VDD, the drain of P13 is coupled to the drain of N13 and the source of N13 is coupled to the voltage supply VSS. The source of P14 is coupled to the voltage supply VDD, the drain of P14 is coupled to the drain of N14, the source of N14 is coupled to the voltage supply VSS. The drain of P13 and the drain of N13 are also coupled to the SQ output. The drain of P14 and N14 are also coupled to the Q output.

The source of P9, the source of N9, the gate of P10 and the gate of N10 are also coupled to the gate of P15 and the gate of N15. The source of P15 is coupled to the voltage supply VDD, the drain of P15 is coupled to the drain of N15 and the source of N15 is coupled to the voltage supply VSS. The drain of P15 and the drain of N15 are also coupled to the QZ output.

SUMMARY OF THE INVENTION

A scannable asynchronous preset and/or clear flip-flop having two latch circuits. The first latch circuit comprises an inverter and a tristate NAND gate. The second latch circuit comprises an inverter and a tristate NOR gate. When the CLK (clock input signal) and CLRZ (the inverse of the clear input signal) are both low, the output of the tristate NOR gate is forced low. Thus the input of inverter is low so that the output signal, Q, is forced low and the inverse output signal, QZ, is forced high. When CLK is high and CLRZ is low the output of tristate NAND gate is forced high so that the input to inverter is high and the input to inverter is low, thereby forcing Q low and QZ high. Thus the outputs Q and QZ are forced low and high respectively when CLRZ is low, regardless of the state of the CLK input.

DESCRIPTION OF THE DRAWINGS

An embodiment of the present invention will now be described with reference to the accompanying drawings.

DETAILED DESCRIPTION OF THE INVENTION

Figure 5:
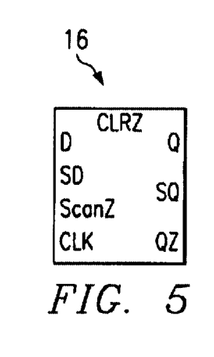
FIG. 5 is a circuit symbol for a modification of the scannable flip-flop of FIG. 1, having an asynchronous clear input.

A variant of the flip-flop of FIGS. 1, 2 and 4 is a scannable flip-flop with an asynchronous clear input; the circuit symbol for which is shown in FIG. 5. The flip-flop of FIG. 5 has a clear input (CLRZ) that is active low so that when CLRZ goes low, Q is forced low and QZ is forced high. Asynchronous means that the clear signal is acted upon immediately without waiting for an edge of the CLK signal.

Figure 6:
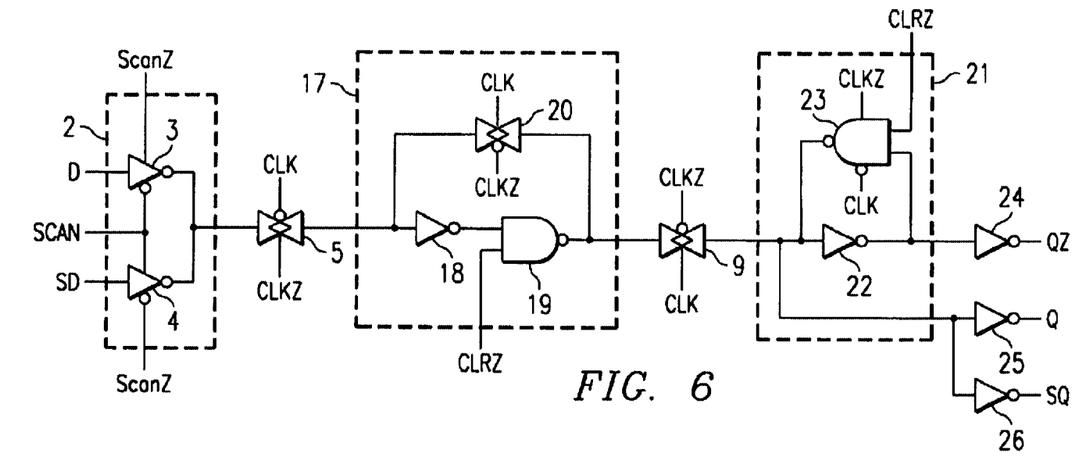
FIG. 6 is a circuit schematic of the flip-flop of FIG. 5.

FIG. 6 shows a known circuit that implements the flip-flop of FIG. 5. The circuit is a variant of that of FIG. 2; indeed the multiplexer 2 and the transmission gates 5 and 9 are unchanged. The variation is in the latch circuits 17 and 21 and the connection of the inverters 24 to 26.

Latch 17 comprises an inverter 18, a NAND gate 19 and a transmission gate 20. The inverter 18 inverts the output of transmission gate 5 and that output is coupled to a first input of NAND gate 19. The second input of NAND gate 19 is coupled to the CLRZ input. The output of NAND gate 19 is coupled to the input of transmission gate 20. Transmission gate 20 couples the output of NAND gate 19 to the input of inverter 18 when CLK is high and is tristate when CLK is low. The output of NAND gate 19 is also coupled to the input of transmission gate 9.

The output of transmission gate 9 is coupled to the input of latch 21. Latch 21 comprises an inverter 22 and a tristate NAND gate 23. The input to latch 21 is coupled to the input of inverter 22 and the output of inverter 22 is coupled to the first input of tristate NAND gate 23. The second input to tristate NAND gate 23 is coupled to the CLRZ input. Tristate NAND gate 23 couples the logical NAND of its inputs to the input of inverter 22 when CLK is low and is tristate when CLK is high. The inputs of inverters 25 and 26 are connected to the input of latch 21 and the input of inverter 24 is connected to the output of latch 21. The outputs of inverters 24, 25 and 26 output signals QZ, Q and SQ respectively.

When CLRZ is low, the output of NAND gate 19 is forced high. The output of NAND gate 19 is propagated through transmission gate 9 provided that CLK is high so that the input of inverter 22 is high under those circumstances. If the input to inverter 22 is high then the Q output is forced low and the QZ output is forced high. When CLK is low, the output of NAND gate 19 is not passed to the input of inverter 22 since the transmission gate 9 is non-conducting. Instead, the output of tristate NAND gate 23 (which will be forced high when CLRZ is low) provides the input to inverter 22. Thus the outputs Q and QZ are forced low and high respectively when CLRZ is low, regardless of the state of the CLK input.

A problem with the circuit of FIG. 6 is that the addition of NAND gate 19 into a critical path between the input and output of the circuit adds an additional delay to the circuit. In high performance flip-flops, such a delay cannot be tolerated.

One object of the present invention is to provide a flip-flop circuit based on the scannable flip-flop of FIG. 2 that also includes an asynchronous clear input, but that does not insert an extra delay.

Having noted that in the circuit of FIG. 6, the tristate NAND gate 23 does not introduce an extra delay into the flip-flop because that circuit element is in the feedback path of latch 21 rather than the critical path of the flip-flop, a first solution considered by the inventors to the problem was to move the additional circuit element (i.e. NAND gate 19) of latch 17 from the critical path to the feedback path of that latch. The circuit schematic for this first solution is shown in FIG. 7.

Figure 7:
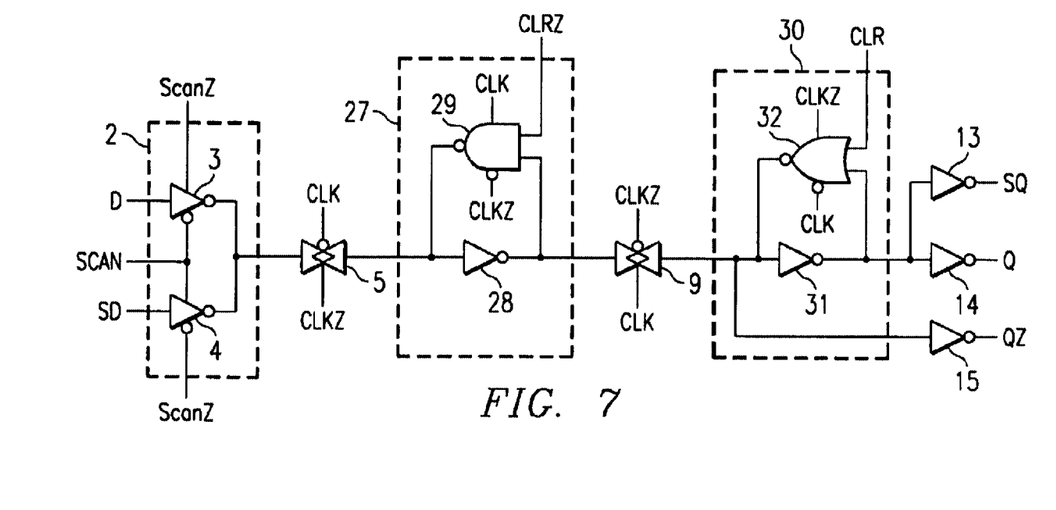
FIG. 7 is a circuit schematic showing a modification of the flip-flop of FIG. 6 according to the invention.

The circuit of FIG. 7 is a variant of the circuits of FIGS. 2 and 6. The multiplexer 2, transmission gates 5 and 9 and inverters 13 to 15 are the same as those in FIG. 2. The variation is in the latch circuits 27, 30.

Referring to FIG. 7, latch 27 comprises an inverter 28 and a tristate NAND gate 29. The input of inverter 28 is coupled to the output of transmission gate 5 and the output of tristate NAND gate 29. The output of inverter 28 is coupled to a first input of tristate NAND gate 29 and the input of transmission gate 9. A second input of tristate NAND gate 29 is coupled to the asynchronous clear input CLRZ. Tristate NAND gate 29 couples the logical NAND of its inputs to the input of inverter 28 when CLK is high and is high impedance when CLK is low.

The output of transmission gate 9 is coupled to an input of latch 30. Latch 30 comprises an inverter 31 and a tristate NOR gate 32. An input to inverter 31 is coupled to the output of transmission gate 9 and an output of tristate NOR gate 32. An output of inverter 31 is coupled to a first input of tristate NOR gate 32 and to the input of inverters 13 and 14. A second input of tristate NOR gate 32 is coupled to a CLR input. The output of tristate NOR gate 32 is also coupled to the input of inverter 15. Tristate NOR gate 32 couples the logical NOR of its inputs to the input of inverter 31 when CLK is low and is high impedance when CLK is high.

When CLK and CLRZ are both low (CLR high), the output of tristate NOR gate 32 is forced low. Thus the input of inverter 31 is low so that the Q output is forced low and the QZ output is forced high. When CLK is high and CLRZ is low, the output of tristate NAND gate 29 is forced high so that the input to inverter 28 is high and the input to inverter 31 is low, thereby forcing Q low and QZ high. Thus the outputs Q and QZ are forced low and high respectively when CLRZ is low, regardless of the state of the CLK input. This is achieved without adding further delays into the critical path of the flip-flop when compared with the flip-flop of FIG. 2.

The circuit of FIG. 7 solves the problem of adding an asynchronous clear input without adding further circuit elements into the critical path of the flip-flop. There is, however, a difficulty with the operation of the circuit.

Figure 8:
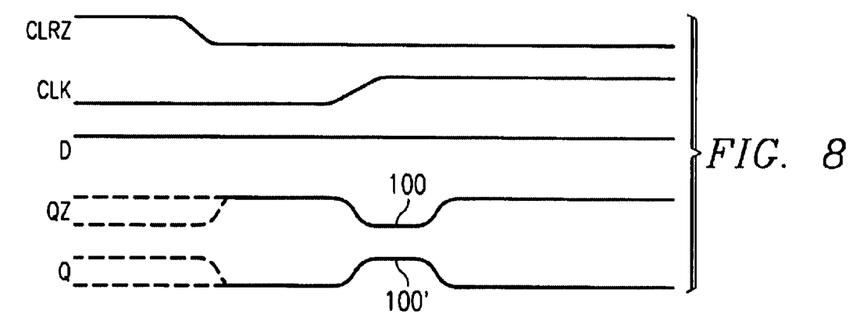
FIG. 8 is a timing diagram illustrating part of the functionality of the flip-flop of FIG. 7.

The timing diagram of FIG. 8 shows the situation when the CLRZ, CLK and D inputs to FIG. 7 are initially high, low and high respectively. The output QZ is initially unknown since it depends on the value of D on the previous rising edge of CLK. In this state, the transmission gate 5 is conducting, transmission gate 9 is high impedance, tristate NOR gate 32 is conducting and tristate NAND gate 29 is high impedance. The D input is therefore propagated through transmission gate 5 to the first input of tristate NAND gate 29. When CLRZ falls from high to low, the output of NOR gate 32 is forced low. Thus the input to inverter 15 is low, and the output QZ is high (and Q, of course, is low), as required in response to the CLRZ input.

In the timing diagram of FIG. 8, CLRZ remains low (active), the D input remains high and the CLK input rises. When CLK rises, the transmission gates 5 and 9 become non-conducting and conducting respectively. Similarly, the tristate NAND gate 29 and the tristate NOR gate 32 become conducting and non-conducting respectively. The input to inverter 15 is coupled, via transmission gate 9, to the output of inverter 28. As discussed above, before the rising edge of the CLK input, the input of inverter 15 is low. However, the output of inverter 28 (now coupled to the input of inverter 15 via transmission gate 9) was previously high (the value of D). The input of inverter 28 must be pulled high by tristate NAND gate 29 (in response to the CLRZ now that tristate NAND gate 29 has become conducting). However, the tristate NAND gate 29 is preferably a small device and it takes time for that NAND gate to pull the input to inverter 28 to a high voltage. As a result, there is a period during which the input to the inverter 15 is high and therefore a period during which the output QZ is low. This appears as a glitch 100 in the timing diagram of FIG. 8. (Note that the glitch also appears on the Q output (labelled 100') because the input to inverter 15 (the output of which provides the QZ output) is coupled to the Q output via inverters 31 and 14 so that the Q output is simply the inverse of the QZ output.)

The problem of the glitch on the QZ output could be solved by increasing the size of the tristate NAND gate 29 but this would have implications on the size of the flip-flop circuit and on its speed of operation. Also, the size of NAND gate that would be required would be process and environment dependent and it could therefore be difficult to ensure that the glitch would not arise under all conditions. Increasing the size of the NAND gate is not therefore a preferred solution to the glitch problem.

Figure 9:
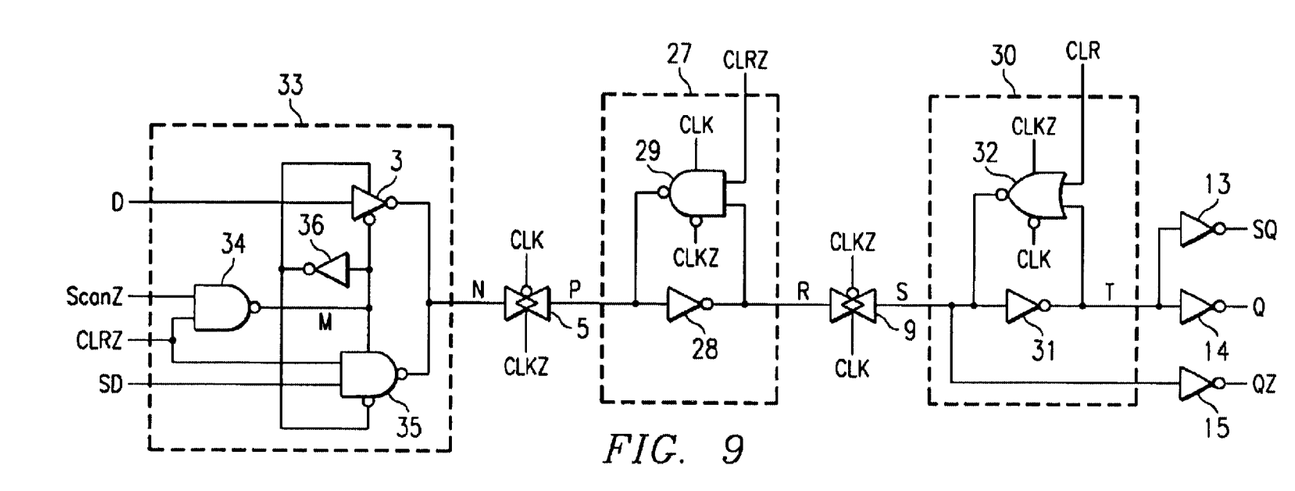
FIG. 9 is a circuit schematic showing a scannable flip-flop with an asynchronous clear input in accordance with a second embodiment of the present invention.

The circuit of FIG. 9 shows a second embodiment of the present invention and is equivalent to the circuit of FIG. 7 except that multiplexer 2 in FIG. 7 has been replaced by multiplexer 33. Multiplexer 33 comprises a NAND gate 34, a tristate NAND gate 35, a tristate inverter 3 and an inverter 36. First and second inputs of NAND gate 34 are coupled to the ScanZ and CLRZ inputs respectively. First and second inputs of tristate NAND gate 35 are coupled to the SD and CLRZ inputs respectively. The input to tristate inverter 3 is coupled to the D input. An input to inverter 36 is coupled to the output of NAND gate 34. Control inputs of the tristate inverter 36 and the tristate NAND gate 35 are coupled to the output of NAND gate 34 and the output of inverter 36 so that tristate inverter 3 is conducting when the output of NAND gate 34 is low (and the output of inverter 36 high) and tristate NAND gate 35 is conducting when the output of NAND gate 34 is high (and the output of inverter 36 is low). The outputs of tristate inverter 36 and tristate NAND gate 35 are coupled together and to the input of transmission gate 5.

When CLRZ is high (inactive), the output of NAND gate 34 is the inverse of ScanZ (i.e. Scan) and the output of inverter 36 is ScanZ. Therefore the output of tristate NAND gate 35 is either high impedance or the inverse of SD. Thus the circuit of FIG. 9 operates in exactly the same manner as the circuit of FIG. 7 when CLRZ is high.

When CLRZ is low (active), the output of NAND gate 34 is forced high so that tristate NAND gate 35 is conducting and tristate inverter 3 is high impedance. Further, the output of tristate NAND gate 35 is forced high (since the CLRZ input to it is low) therefore the input to transmission gate 5 is also high.

When the CLK input is low, the input to transmission gate 5 is passed to the input of latch 27. When the CLK input is high and the CLRZ input is low, the input of latch 27 is pulled high by tristate NAND gate 29 in the same manner as in the circuit of FIG. 7.

The glitch problem associated with the circuit of FIG. 7 was caused by the propagation of the D or SD inputs to output of latch 27. This problem is overcome in the present embodiment by blocking the D or SD inputs in the multiplexer stage when CLRZ is low.

Figure 10:
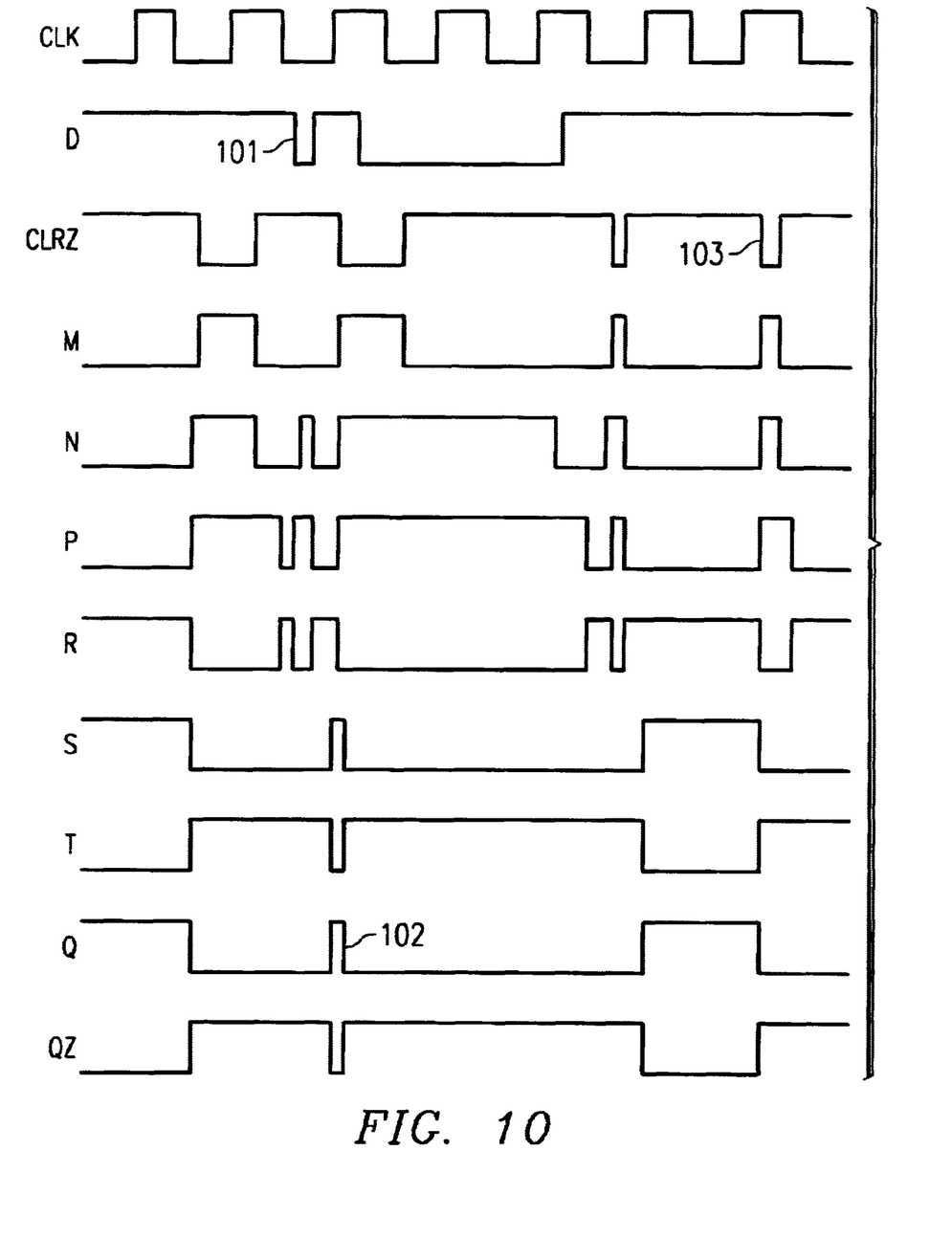
FIG. 10 is a timing diagram illustrating part of the functionality of the flip-flop of FIG. 9.

The operation of the circuit of FIG. 9 will now be described with reference to the timing diagram of FIG. 10. A number of nodes in FIG. 9 have been labelled and the voltages at those nodes are shown in FIG. 10 for a variety of input conditions. Node M is the output of NAND gate 34. Node N is the output of tristate NAND gate 35 and tristate inverter 36. Node P is the output of transmission gate 5. Node R is the output of inverter 28. Node S is the output of transmission gate 9. Node T is the output of inverter 31.

The timing diagram of FIG. 10 assumes that the ScanZ input is high. In that case, the output of NAND gate 34 (node M) is the inverse of the CLRZ input. Node M is also one of the control inputs of tristate inverter 36 the other control input being the inverse of the value at node M provided by the inverter 36. With node M low (i.e. with ScanZ high and CLRZ high), tristate inverter 36 inverts the D input, but is high impedance when node M is high. Node N is therefore the inverse of D when CLRZ is high but the output of inverter 3, which drives it, is high impedance when CLRZ is low. This is shown in the timing diagram of FIG. 10.

When CLK is low, node P follows the voltage at node N. When CLK is high, node P follows the output of tristate NAND gate 29 i.e. the logical NAND of node R and the CLRZ input. Node R is the inverse of node P. Similarly, the voltage at node S follows that at node R when CLK is high and follows the output of tristate NOR gate 32 i.e. the logical NOR of node T and the CLR input when CLK is low. Node T and the output QZ are the inverse of node S and the output Q is the inverse of node T.

In the example of FIG. 10, nodes D, P, and S are initially stable at high, low and high respectively and the CLK input is low. The Q and QZ outputs are therefore at high and low logic levels respectively. With CLK low, node P follows node N and node S is the logical NOR of the CLR input and node T. When CLK rises, node P is the logical NAND of the CLRZ input and node R, and node S follows node R. Since the circuit is stable, neither node P or node S changes as a result of the CLK change. Similarly, when CLK falls, neither of those nodes changes state.

With CLK low and the internal nodes as stated above, the CLRZ input falls from a high to a low logic level in the example of FIG. 10. In response, node M rises, disabling tristate inverter 3 and enabling tristate NAND gate 35. Node N is forced high (since CLRZ is low). Node P follows node N (i.e. rises) and node R falls. At substantially the same time, node S (which is the logical NOR of node T and the CLR input) falls since CLR is high (the inverse of CLRZ). As node S falls, node T and the output QZ rise and the output Q falls.

The CLRZ input remains low, whilst CLK rises. Node P is unchanged (since the logical NAND of CLRZ and node R is the same as the logic level at node N) and node S is unchanged (since node R is at the same logic level as the logical NOR of CLR and node T). The circuit is therefore stable. When CLRZ rises with CLK high, node N becomes the inverse of input D (i.e. falls). Node P, however, is unchanged since it is the logical NAND of CLRZ and node R, both of which are unchanged. Since node P is unchanged, nodes R and S are unchanged. The change at node N in response to the rising CLRZ input does not therefore propagate to the outputs Q and QZ. The circuit is once again stable and the internal nodes and the outputs are unchanged when the CLK input falls for the reasons discussed above.

When the voltage at node D falls with the CLK input low, node N rises, since it is the inverse of the D input and nodes P and R rise and fall respectively since the transmission gate 5 is conducting. (This is shown by the pulse 101 inserted into the waveform of D for the purpose of illustration.) The low logic level at node R is not passed to node S since the transmission gate 9 is non-conducting. At 101 the D input rises before the CLK input has changed and nodes N, P and R fall, fall and rise respectively. When the CLK input rises, the high logic level at node R is passed to the node S (which was already high) and the output Q is therefore unchanged. The pulse 101 at the D input is not passed to the output, since it was not retained over a rising CLK edge.

When, with the CLK input at a high logic level, the CLRZ input is pulled low (active), node M rises in response and the tristate inverter 3 becomes high impedance. With CLK high, node P is the logical NAND of node R and the CLRZ input. Since CLRZ is low, node P is pulled high, which in turns pulls node R low. Node S falls in response to node R falling since transmission gate 9 is conducting and output Q therefore falls. The fall in output Q 102 is not synchronised to the CLK signal. The CLRZ input is therefore an asynchronous input.

When the CLRZ input rises again, the CLK input is low. Tristate inverter 3 is active again since node M falls when CLRZ rises. Thus node N is high (the inverse of D). Nodes P and R are high and low respectively since transmission gate 5 is conducting. The voltage at node S is determined by the logical NOR of node T and the CLR input. When CLR falls (as CLRZ rises), the output of tristate NOR gate 32, and therefore node S, is unchanged (low) since node T was already high. The output Q therefore remains low and the circuit is stable.

The circuit remains stable until the D input rises in response to which node N falls. This occurs with CLK high so that no other node change until CLK falls. On the falling edge of the CLK input, nodes P and R fall and rise respectively, since transmission gate 5 becomes conducting.

Shortly after the falling edge of the CLK input, the CLRZ input falls. As before, in response to the falling CLRZ input, node M rises, so that the output of tristate inverter 3 is high impedance. Node N is instead driven by tristate NAND gate 35 which provides a high since CLRZ is low. Node P is therefore high, node R is low, node S is low, node T is high and output Q is low. Output Q is not changed by the CLRZ signal since it was already low.

When CLRZ rises, nodes P and R change to low and high respectively. This is because the D input is still high and the transmission gate 5 is still conducting. The high at the D input is propagated to node S (and hence to output Q) on the next rising edge of the CLK signal as described above. The Q output is then forced low again by the falling CLRZ input 103.

The timing diagram of FIG. 10 therefore shows that with the CLRZ input high, on each rising edge of the CLK input, the value at node D is propagated to the output Q and whenever the CLRZ input falls, the output Q is forced low, irrespective of the CLK input.

The glitch that occurred at the output of FIG. 7, as shown in the timing diagram of FIG. 8, does not occur in the circuit of FIG. 9. The glitch at the output of the circuit of FIG. 7 occurred with the CLRZ, CLK and D inputs initially low, low and high respectively so that the Q output was forced low by the active CLRZ input. In that state, when CLK input rises, a glitch 100, 100' occurs at the output for the reasons discussed above. In the circuit of FIG. 9, this does not occur because, with the CLRZ, CLK and D inputs low, low and high, the output of tristate inverter 3 is high impedance and the node N is driven high by tristate NAND gate 35. With node N high (since CLRZ is low) the input to latch 27 is forced high. Therefore, when CLK rises, tristate NAND gate 29 does not need to force node P high since it is already high so that no glitch occurs at the output.

Figure 11:
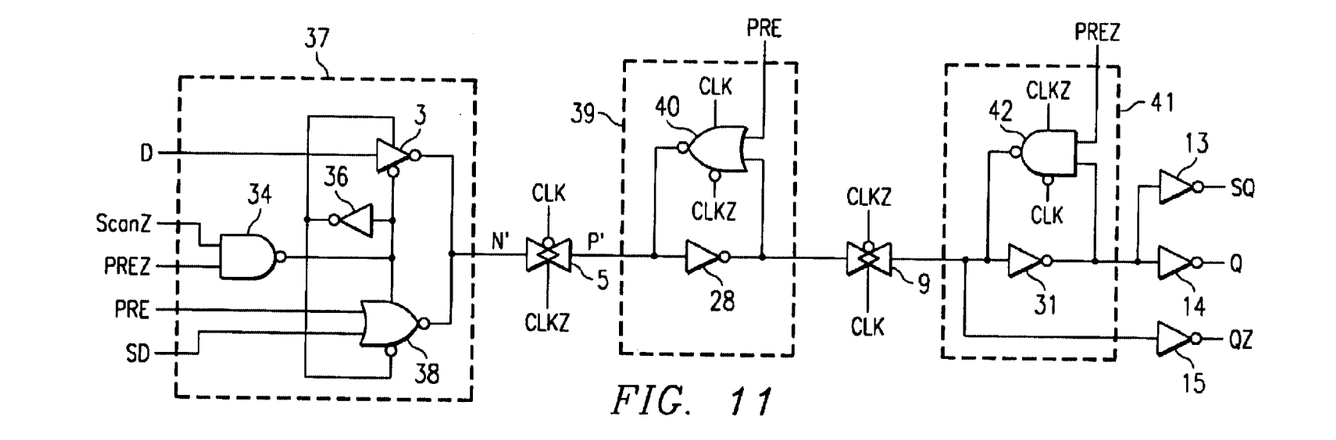
FIG. 11 is a circuit schematic showing a scannable flip-flop with an asynchronous preset input in accordance with a third embodiment of the present invention.

FIG. 11 shows a third embodiment of the present invention, which like the second embodiment is free of the glitch problem. In FIG. 11, the asynchronous clear input (CLRZ) of the embodiment of FIG. 9 is replaced by an asynchronous preset input (PREZ). The Q output is forced high whenever the PREZ input is active (low). The circuit is similar to that of FIG. 9 except that: the inputs to NAND gate 34 are ScanZ and PREZ; tristate NAND gate 35 is replaced by tristate NOR gate 38 with the CLRZ input replaced with a PRE input (the inverse of PREZ); tristate NAND gate 29 is replaced by tristate NOR gate 40 with the input CLRZ replaced with the input PRE; and tristate NOR gate 32 is replaced by tristate NAND gate 42 with the input CLR replaced with input PREZ. NAND gate 34, tristate inverter 3, inverter 36 and tristate NOR gate 38 make up a multiplexer 37; inverter 28 and tristate NOR gate 40 make up a latch 39 and inverter 31 and tristate NAND gate 42 make up a latch 41.

When input PREZ is high (inactive), the circuit of FIG. 11 reduces to that of FIG. 9 since NAND gate 34 inverts the ScanZ input, tristate NOR gate 38 is effectively a tristate inverter, tristate NOR gate 40 is effectively a tristate inverter and tristate NAND gate 42 is effectively a tristate inverter.

When input PREZ is low (active), the output of NAND gate 34 is high so that tristate inverter 3 is high impedance, thereby blocking the D input. With the PREZ input low, the output Q is forced high by the output of tristate NOR gate 40 being low when CLK is high by the output of tristate NAND gate 42 being high when CLK is low.

The glitch that occurred in the circuit of FIG. 7 is suppressed by tristate NOR gate 38 outputting a low in response to PREZ being low (PRE high).

Figure 12:
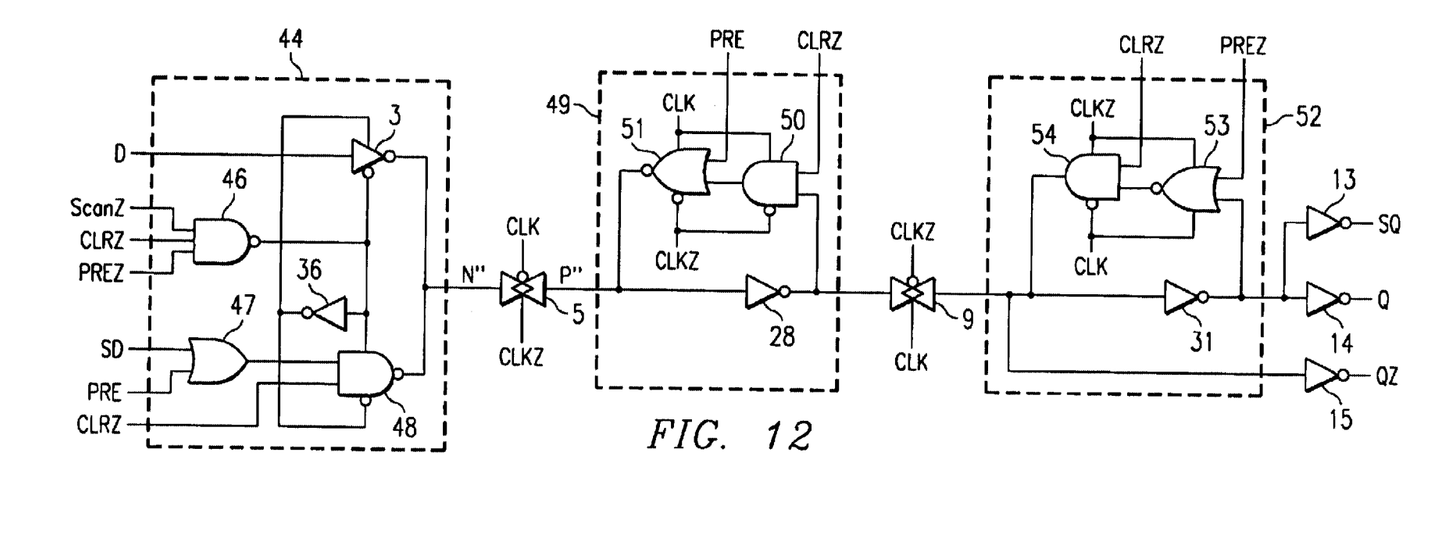
FIG. 12 is a circuit schematic showing a scannable flip-flop with an asynchronous clear input and an asynchronous preset input in accordance with a fourth embodiment of the present invention.

FIG. 12 shows a fourth embodiment of the invention that includes both an asynchronous clear input (CLRZ) and an asynchronous preset input (PREZ). The circuit of FIG. 12 is similar to that of FIG. 9. NAND gate 34 has been replaced by three-input NAND gate 46, those inputs being ScanZ, CLRZ and PREZ. Tristate NAND gate 35 is replaced by OR gate 47 and tristate NAND gate 48. The first and second inputs of OR gate 47 are coupled to the SD and PRE inputs respectively, the output of OR gate 47 is coupled to the first input of tristate NAND gate 48 and the second input of tristate NAND gate 48 is coupled to the CLRZ input. Tristate NAND gate 29 is replaced by tristate AND gate 50 and tristate NOR gate 51. The first input, second input and output of tristate AND gate 50 are coupled to the output of inverter 28, the CLRZ input and a first input to tristate NOR gate 51 respectively. The second input of tristate NOR gate 51 is coupled to the input PRE. The output of tristate NOR gate 51 is coupled to the input of inverter 28. Tristate NOR gate 32 is replaced by tristate NOR gate 53 and tristate AND gate 54. The first input, second input and output of tristate NOR gate 53 are coupled to the output of inverter 31, the PREZ input and the first input of tristate AND gate 54 respectively. The second input and the output of tristate AND gate 54 are coupled to the CLRZ input and the input of inverter 31 respectively.

In the circuit of FIG. 12: tristate inverter 3, inverter 36, NAND gate 46, OR gate 47 and tristate NAND gate 48 collectively make up multiplexer 44; inverter 28, tristate NAND gate 50 and tristate NOR gate 51 collectively make up latch 49; and inverter 31, tristate NAND gate 53 and tristate AND gate 54 collectively make up latch 52.

When PREZ and CLRZ are both high (inactive), the circuit of FIG. 12 reduces to that of FIG. 9, since NAND gate 46 implements an inverter and circuit elements 47 and 48, 50 and 51, and 53 and 54 implement tristate inverters.

When either CLRZ or PREZ is low, the output of NAND gate 46 is high so that the output of tristate inverter 3 is tristate. Tristate NAND gate 48 then produces a logic high if CLRZ is low (and PREZ is high) and a logic low if PREZ is low (and CLRZ is high) thereby suppressing the glitch in the same manner that it is suppressed in the second and third embodiments respectively. (It is not permissible during the normal operation of the flip-flop to allow both PREZ and CLRZ to be low.)

When PREZ is low, CLRZ is high and CLK is high, the output of tristate NOR gate 51 is low and therefore the output of latch 49 is high. The output of latch 49 is passed to the output Q via transmission gate 9 so that the output Q is forced high. When PREZ is low, CLRZ is high and CLK is low, the output of tristate AND gate 54 is high, thereby forcing the Q output high. Thus the Q output is forced high when PREZ is low and CLRZ is high regardless of the state of CLK.

When PREZ is high, CLRZ is low and CLK is high, the output of tristate NOR gate 51 is high and therefore the output of latch 49 is low, thereby forcing the Q output low. When PREZ is high, CLRZ is low and CLK is low, the output of tristate NAND gate 54 is low, thereby forcing the output of latch 52 high and the Q output low. Thus the Q output is forced low when CLRZ is low and PREZ is high regardless of the state of CLK.

In the circuits of FIGS. 2 and 7, if the ScanZ input is low, the circuit operates in exactly the same manner as when ScanZ is high except that the SD input is propagated through the circuit rather the D input. The circuits of FIGS. 9, 11 and 12 are more complicated.

One of the advantages of the circuit of FIG. 9 is that it prevents the D input from propagating to node R when the CLRZ input is active. This is done by disabling the tristate inverter 3 by pulling node M high. However, when ScanZ is low, node M is high regardless of the state of the CLRZ input. Thus tristate NAND gate 35 will be turned on. In order to prevent the SD input from propagating to node R when the CLRZ input is active, the second input to tristate NAND gate 35 is coupled to the CLRZ input. Thus, when CLRZ is low (active) the output of tristate NAND gate 35 is high regardless of the SD input. If CLK is low, the high output of tristate NAND gate 35 is passed to node P and node R is therefore low. As a result, when the CLK input rises, the value of node P is already high so that tristate NAND gate 29 does not need to pull that node high. The glitch that is seen with the circuit of FIG. 7 therefore does not occur.

The tristate NOR gate 38 in FIG. 11 works in a similar way by forcing node N' low when PREZ is low and ScanZ is low so that tristate NOR gate 40 will not be required to pull node P' high.

In FIG. 12, when CLRZ and ScanZ are low and PREZ is high, the output of tristate NAND gate 48 is high so that tristate NOR gate 51 will not be required to pull a node P" high. When PREZ and ScanZ are low and CLRZ is high, the output of tristate NAND gate 48 is low so that tristate NOR gate 51 will not be required to pull node P" low.

Thus each of the multiplexers 33, 37 and 44 are adapted to ensure that the output of the multiplexer when ScanZ is low is such that the condition that causes the glitch in the circuit of FIG. 7 does not arise.

Embodiments of the present invention have now been described. It will be understood by those skilled in the art that there are alternative configurations of the various logic circuits in FIGS. 7, 9, 11 and 12 that would perform the same functions. Such alternative configurations are within the scope of the present invention.

Further the circuit of FIG. 7 provides a flip-flop with an asynchronous clear input. Although it suffers from the glitch described which may not be a problem in all circumstances. Moreover the glitch may be resolvable by other means, for example a larger tristate NAND gate 29 as noted above.

Each of the embodiments described above includes a scan input and a scan control input to control whether the data input (D) or the scan input (SD) is selected by the multiplexer circuit. This invention can also be applied to flip-flops without scan inputs. In order to implement, for example, a glitch-free flip-flop in accordance with the present invention that has an asynchronous clear (CLRZ) input but no scan input, the circuit of FIG. 9 could be modified so that the multiplexer 33 was replaced with a single NAND gate with a D-input and a CLRZ input. That NAND gate would invert the D input when CLRZ was high (inactive) and would be high regardless of the D input when CLRZ was low (active). Similar changes to multiplexer 37 in FIG. 11 and multiplexer 44 in FIG. 12 would convert the circuits of FIGS. 11 and 12 into non-scan flip-flops with asynchronous PREZ and asynchronous CLRZ and PREZ inputs respectively. In the circuit of FIG. 7 the multiplexer 2 could be replaced by an inverter to provide a fast flip-flop with an asynchronous clear input—further, a similar circuit may be provided with asynchronous PREZ or asynchronous PREZ and CLRZ inputs.

While each of the embodiments of FIGS. 7, 9, 11 and 12, have been illustrated with logic gates 29, 32, 39, 42 51 and 54 i.e. those in the feedback portion of each latch, being clocked tristate latches they may nonetheless be ordinary logic gates without a high impedance state and the clock input. Such circuits will function as those illustrated if the outputs of those logic gates are weak so that the output may be overcome the signal received through the respective transmission gate.

What is claimed is:

1. A flip-flop comprising
a data input; a data output; a set signal input; a clock signal input; and
at least one stage comprising:
an input node connected to receive a data signal from the data input; an output node; an internal node;
a first gating means responsive to the clock signal to switch alternately between a conducting state, in which a logic signal at the input node of the at least one stage is passed to the internal node, and a high impedance state;
a buffer means coupled to the internal node to provide a logic level at the internal node, either inverted or non-inverted, at the output node of the at least one stage; and
second gating means coupled to combine logically the logic level at the output node of the at least one stage with the set signal to provide to the internal node the result of the logical combination, the logical combination being such that when the set signal is active the output of the second gating means is set to a particular one of high and low logic levels,
wherein the flip-flop further comprises means for providing at the internal node the particular logic level in response to the set signal at a time before the second gating means responds to the set signal to set the internal node to the particular logic level,
wherein the means for providing the particular level provides that logic level to the said internal node via the first gating means, and
wherein the means for providing the particular logic level comprises a third gating means connected to receive the data signal and to provide to the input node of the at least one stage the particular logic level when said set signal is active and the data signal when said set is inactive, the flip-flop further comprising:
a data select input;
a plurality of data inputs, one of which is said data input; and
a multiplexer wherein the third gating means is comprised in the multiplexer and the multiplexer is connected to receive the plurality of data inputs and the data select input and to supply a particular one of the plurality of data inputs to the input node of the at least one stage of the flip-flop in response to the data select signal.

2. The flip-flop of claim 1, wherein the third gating means has a tristate output and the multiplexer comprises a control circuit for combining the data select signal and the set signal to provide one or more control signals that enable the output of the third gating means, and prevent the other data signals of the plurality from being output by the multiplexer, both whenever the data signal gated by the third gating means is indicated by the data select signal and whenever the set signal is active, and that otherwise make the output of the third gating means high impedance.

3. A flip-flop comprising
   a data input; a data output; a set signal input; a clock signal input; and
   a first stage and a second stage, each such stage comprising:
      an input node connected to receive a data signal from the data input; an output node; an internal node;
      a first gating means responsive to the clock signal to switch alternately between a conducting state, in which a logic signal at the input node of the at least one stage is passed to the internal node, and a high impedance state;
      a buffer means coupled to the internal node to provide a logic level at the internal node, either inverted or non-inverted, at the output node of the at least one stage; and
      second gating means coupled to combine logically the logic level at the output node of the at least one stage with the set signal to provide to the internal node the result of the logical combination, the logical combination being such that when the set signal is active the output of the second gating means is set to a particular one of high and low logic levels,
      wherein the flip-flop further comprises means for providing at the internal node the particular logic level in response to the set signal at a time before the second gating means responds to the set signal to set the internal node to the particular logic level,
   the input node of the second stage being coupled to the output node of the first said stage and the flip-flop circuit being responsive to the set signal to set the output of the second stage to a particular logic level.

4. A flip-flop comprising
   a data input; a data output; a set signal input; a clock signal input; and
   at least one stage comprising:
      an input node connected to receive a data signal from the data input; an output node; an internal node;
      a first gating means responsive to the clock signal to switch alternately between a conducting state, in which a logic signal at the input node of the at least one stage is passed to the internal node, and a high impedance state;
      a buffer means coupled to the internal node to provide a logic level at the internal node, either inverted or non-inverted, at the output node of the at least one stage; and
      second gating means coupled to combine logically the logic level at the output node of the at least one stage with the set signal to provide to the internal node the result of the logical combination, the logical combination being such that when the set signal is active the output of the second gating means is set to a particular one of high and low logic levels,
      wherein the flip-flop further comprises means for providing at the internal node the particular logic level in response to the set signal at a time before the second gating means responds to the set signal to set the internal node to the particular logic level,
   the flip-flop further comprising:
      a data select input;
      a plurality of data inputs, one of which is said data input; and
      a multiplexer, wherein the means for providing the particular logic level is comprised in the multiplexer, and the multiplexer is connected to receive the data selected input and the plurality of data inputs and to supply a particular one of the plurality of data inputs to the input node of the at least one stage of the flip-flop in response to the data select signal.

5. A flip-flop comprising
   a data input; a data output; a set signal input; a clock signal input; and
   at least one stage comprising:
      an input node connected to receive a data signal from the data input; an output node; an internal node;
      a first gating means responsive to the clock signal to switch alternately between a conducting state, in which a logic signal at the input node of the at least one stage is passed to the internal node, and a high impedance state;
      a buffer means coupled to the internal node to provide a logic level at the internal node, either inverted or non-inverted, at the output node of the at least one stage; and
      second gating means coupled to combine logically the logic level at the output node of the at least one stage with the set signal to provide to the internal node the result of the logical combination, the logical combination being such that when the set signal is active the output of the second gating means is set to a particular one of high and low logic levels,
      wherein the flip-flop further comprises means for providing at the internal node the particular logic level in response to the set signal at a time before the second gating means responds to the set signal to set the internal node to the particular logic level, and
      wherein the set signal is in complementary form comprising non-inverted and inverted signals and the components if the flip-flop responsive to the set signal are connected to receive one or the other or both of the inverted and non-inverted signals.

* * * * *